United States Patent
Ko

(10) Patent No.: US 6,922,402 B1
(45) Date of Patent: Jul. 26, 2005

(54) MUTUAL FREQUENCY LOCKING ACROSS A LINK

(75) Inventor: Herbert L. Ko, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/490,742

(22) Filed: Jan. 25, 2000

(51) Int. Cl.[7] .............................. H04B 7/00; H04L 7/04
(52) U.S. Cl. .................... 370/281; 370/516; 455/73; 455/265; 375/362; 375/371; 331/46
(58) Field of Search .................... 370/277, 281, 370/516; 455/73, 119, 208, 265, 317, 344, 466, 500, 550, 572; 375/272, 273, 279, 303, 308, 323, 334, 362, 371, 373, 376, 357; 331/2, 46, 47, 48, 49, 52

(56) References Cited

U.S. PATENT DOCUMENTS

| | | | |
|---|---|---|---|
| 4,759,078 A | * 7/1988 | Schiller | 455/500 |
| 5,526,527 A | * 6/1996 | Lipowski et al. | 455/183.1 |
| 5,640,431 A | * 6/1997 | Bruckert et al. | 375/344 |
| 5,995,812 A | * 11/1999 | Soleimani et al. | 455/119 |
| 6,442,374 B1 | * 8/2002 | Brady et al. | 455/73 |

OTHER PUBLICATIONS

Cesar Carralero et al—"Automatic Reference Oscillator Tuning Strategy"; Motorola Technical Developments, Motorola Inc., Schaumburg, Illinois, U.S.; vol. 10, Mar. 1990; pp. 34–35.
A. Plattner et al—"A 60 GHZ Hand–Held LPI–Transceiver"; Proceedings Of The European Microwave Conference, Helsinki, Sep. 13–17, 1982; Sevenoaks, Microwave Exhibitions, GB; vol. Conf. 12, 1982, pp. 540–544.
European Search Report—EP 01 30 0377 dated Jul. 18, 2002.

* cited by examiner

Primary Examiner—Chi Pham
Assistant Examiner—Afsar M. Qureshi
(74) Attorney, Agent, or Firm—Robert T. Martin

(57) ABSTRACT

Transmitter frequency locking across a full duplex communications link. An offset in one transmitter results in an offset at the corresponding receiver. That receiver offset shifts its transmitter in a corresponding manner, causing a correcting offset in the first receiver, which is used to correct the first transmitter. A first embodiment uses filtered received frequency information derived from a baseband demodulator to correct transmitter frequency. A second embodiment uses filtered frequency information from a frequency detector to correct transmitter frequency.

10 Claims, 4 Drawing Sheets

MUTUAL FREQUENCY LOCKING ACROSS A LINK

BACKGROUND OF THE INVENTION

1. Field of the Invention

The present invention pertains to methods of achieving transmitter frequency lock between nodes in a full duplex communications link.

2. Art Background

A full duplex link consists of two transmitter/receiver nodes, using two frequencies. Typical designs make use of a reference oscillator for each transmitter and receiver, four total. The two operating frequencies are typically offset by a fixed amount. When operating radio links at millimeter wavelengths, for example in the neighborhood of 60 Giga Hertz (GHz), phase locked loop (PLL) techniques commonly used at lower frequencies that allow one reference to be derived from the other are impractical. For example, using frequencies of 60 and 62.5 GHz, stable dividers which will work over a wide temperature range are difficult to make. Intermediate frequency (IF) PLL designs which will hand/e large bandwidth (on the order of 1.5 GHz) require IF frequencies high enough so that they interfere with received signals.

What is needed is a way of achieving frequency lock in a duplex link which does not require separate reference oscillators for both transmitter and receiver.

SUMMARY OF THE INVENTION

Frequency lock between nodes in a full duplex link is maintained by using received frequency information to tune the transmit carrier frequency, simultaneously locking both transmit carrier frequencies in the link. An offset in the carrier frequency of one transmitter is detected as an offset at the corresponding receiver. That receiver shifts its transmitter carrier frequency in a corresponding manner, signaling the offset to the other transmitter. This is detected as a correcting offset in the other receiver, which corrects the carrier frequency of its transmitter. A first embodiment uses filtered received frequency information derived from a baseband demodulator to correct transmitter frequency. A second embodiment uses filtered frequency information from a frequency detector to correct transmitter frequency.

BRIEF DESCRIPTION OF THE DRAWINGS

The present invention is described with respect to particular exemplary embodiments thereof and reference is made to the drawings in which.

DETAILED DESCRIPTION

Figure 1:
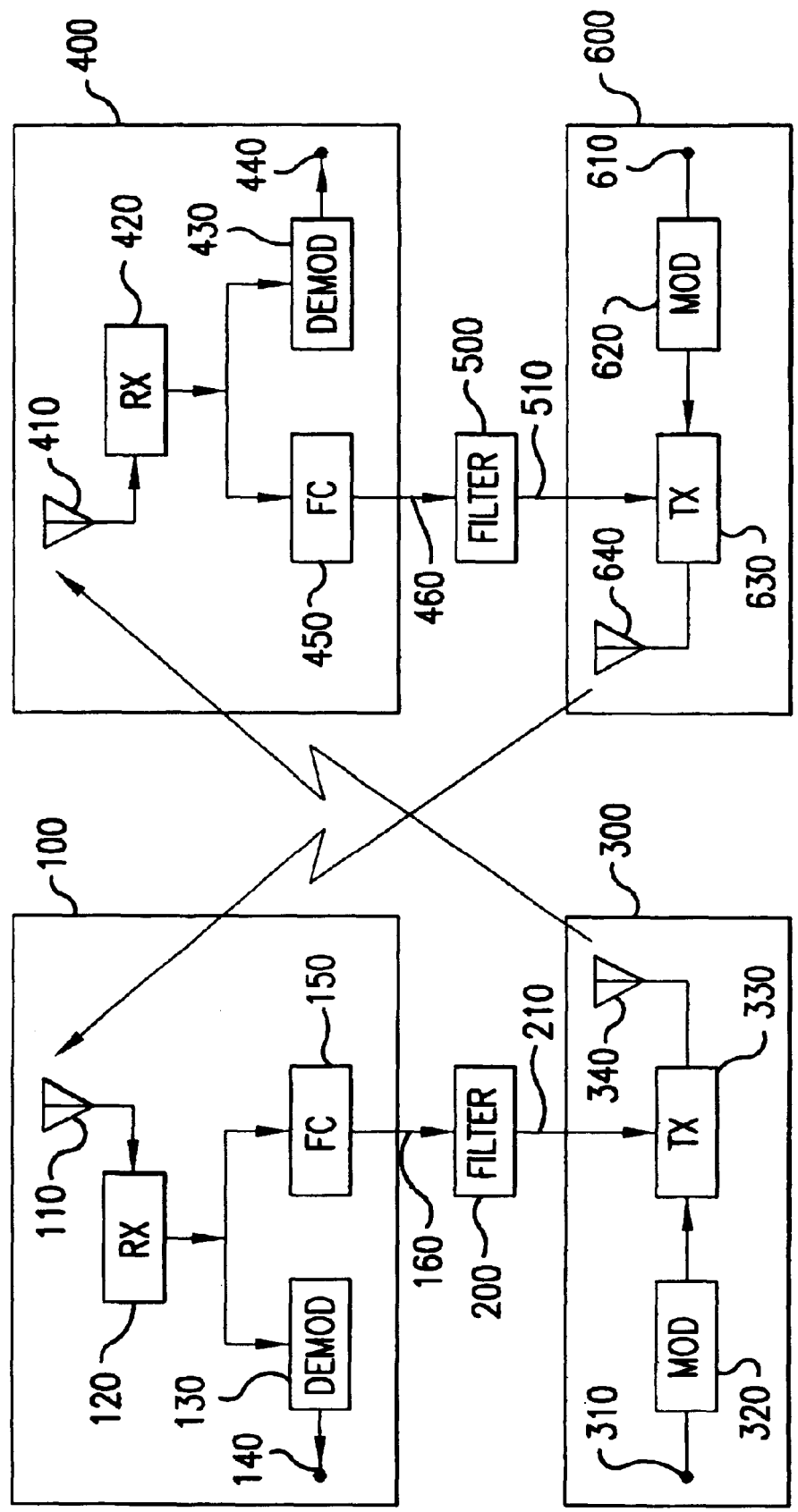
FIG. 1 is a block diagram showing the present invention.

FIG. 1 shows a block diagram of the present invention. Receiver 100 operates at a first predetermined frequency. While FIG. 1 shows signals propagating between receivers and transmitters using antennas, one or more wire connections may also be used, and if the invention is used in the optical domain, one or more optical fibers may be used. Receiver block 120 supplies signals to demodulator 130, which demodulates the data and presents it to data output 140, and to frequency comparator 150. The error output 160 of frequency comparator 150 represents the difference between the predetermined operating frequency of the receiver and the carrier frequency being received.

Error output 160 is filtered 200 producing transmitter tuning signal 210.

Transmitter 300 operates at a second predetermined frequency. Data input 310 is passed to modulator 320 and to transmitter 330, whose frequency is determined by transmitter tuning signal 210. Transmitter block 330 drives antenna 340, or connects to other suitable transmission media.

Receiver 400 operates at the second predetermined frequency used by transmitter 300. While the input to receiver block 420 is shown as antenna 410, the receiver input could be a wire connect or an optical fiber. Receiver block 420 supplies signals to demodulator 430, which demodulates the data and presents it to data output 440, and to frequency comparator 450. The error output 460 of frequency comparator 450 represents the difference between the predetermined operating frequency of the receiver and the carrier frequency being received.

Error output 460 is filtered 500 producing transmitter tuning signal 510.

Transmitter 600 operates at the first predetermined frequency, shared with receiver 100. Data input 610 is passed to modulator 620 and to transmitter 630, whose frequency is determined by transmitter tuning signal 510. Transmitter block 630 drives antenna 640, or connects to other suitable transmission media.

In operation, assume that carrier frequency of transmitter 600 is high in frequency. When received by receiver 100, this produces an error output 160 on frequency comparator 150, which is filtered 200, shifting 210 the carrier frequency of transmitter 330, signaling the offset in the incoming signal to receiver 400.

Receiver 400 receives the signal from transmitter 300, producing a corresponding error output 460 which is filtered 500, shifting 510 the carrier frequency of transmitter 600, correcting the offset detected by receiver 100.

Note that the technique described is independent of the frequency or modulation used. An offset in carrier frequency at a first node is sensed and signaled to a second node by offsetting the carrier frequency of the first node's transmitter. The second node, employing the same process, senses the offset and corrects its transmit carrier frequency.

Figure 2:
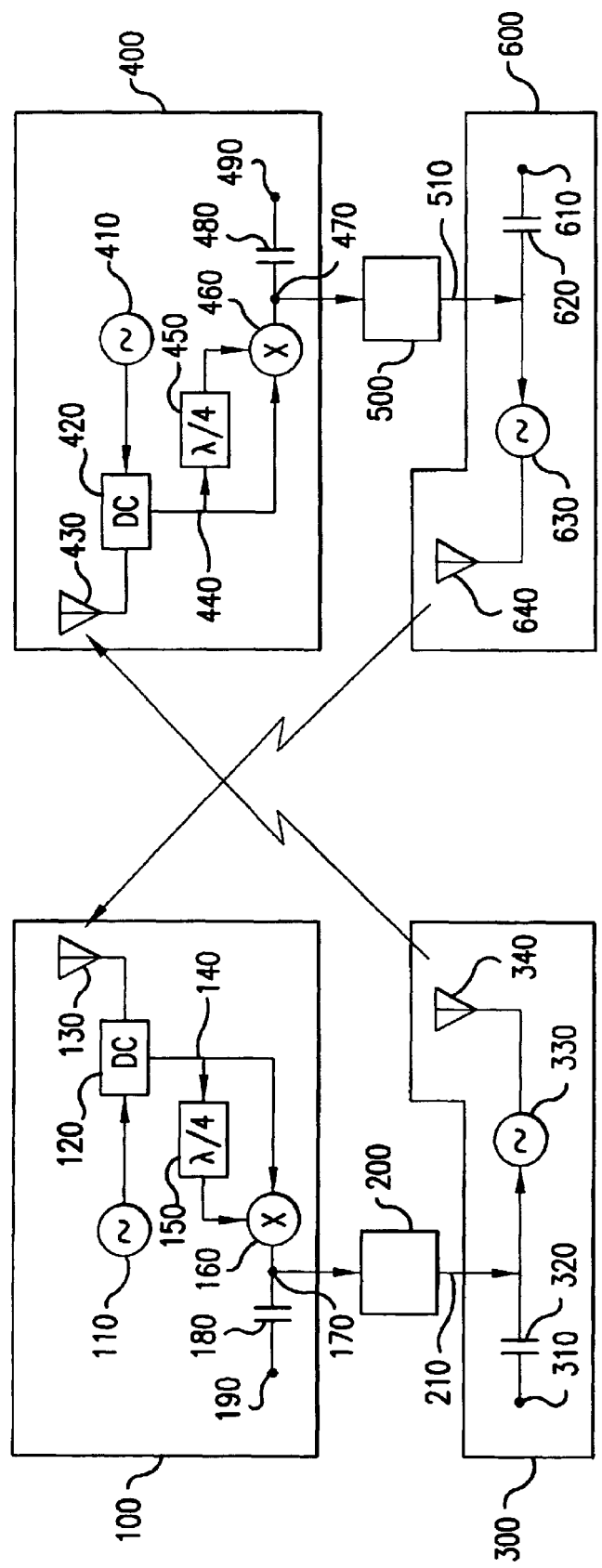
FIG. 2 is a block diagram of a full duplex radio link using the present invention.

FIG. 2 shows a frequency modulated full duplex radio link according to the present invention. Receiver 100 and transmitter 600 share one operating frequency, and transmitter 300 and receiver 400 share a second frequency. In the present embodiment, receiver 100 and transmitter 600 operate at a frequency of 62.5 GHz. Transmitter 300 and receiver 400 operate at 60 GHz.

It should be understood that the techniques described herein are also applicable to other frequencies, and that both frequencies do not have to be in the same band. For example, these techniques are equally applicable at 2.6 GHz, or to split links, for example 900 MHz and 2.6 GHz.

In receiver 100, reference oscillator 110 generates a 60 GHz signal. This is typically produced using an oscillator phase locked to a reference, as is known to the art. Other suitably stable known implementations may also be used. The output of reference oscillator 110 is combined with the signal from antenna 130 in downconverter 120, producing an intermediate frequency (IF) output 140. Since the input frequency of receiver 100 is 62.5 GHz and the reference frequency from oscillator 110 is 60 GHz, IF output 140 is at 2.5 GHz. In the present embodiment, data is encoded using frequency shift keying (FSK).

IF signal 140 is then converted to a baseband signal. In the preferred embodiment, a delay-line discriminator is used. Delay element 150 introduces a quarter wavelength delay into 2.5 GHz IF signal 140. IF signal 140 is mixed 160 with the output of delay element 150 to produce baseband output 170. Alternative frequency discrimination techniques known to the art may also be used.

Output 170 contains an alternating current (AC) component and a direct current (DC) component.

Blocking capacitor 180 passes the AC component, which contains the data, to output data terminal 190. In the preferred embodiment, the data signal is a high data rate (up to a gigabit per second) signal.

The DC component of output 170 corresponds to the error offset of the incoming signal frequency at antenna 130, in this case the output of transmitter 600 and its antenna 640, from the desired center frequency of receiver 100, in this case 62.5 GHz. This DC component is used to tune transmitter 300 after passing through filter 200.

For other modulation schemes, such as an amplitude modulated video signal, a separate demodulator and frequency comparator may be required, as is shown in FIG. 1.

Transmitter 300 accepts data input at port 310. The AC component of this data is passed by blocking capacitor 320 and combined with DC tuning signal 210 from filter 200. This combined signal modulates voltage controlled oscillator 330, producing a frequency modulated (FM) signal at antenna 340. The center frequency of transmitter 300 is 60 GHz, established by the DC level of tuning signal 210.

Receiver 400 operates in a similar manner to receiver 100, except that it uses a reference oscillator 410 operating at 62.5 GHz, and an input frequency of 60 GHz. The output of reference oscillator 410 is combined with the signal from antenna 430 in downconverter 420, producing an IF output 440, at 2.5 GHz. Note the inversion of reference and receive frequencies from those used in receiver 100.

IF signal 440 is then converted to baseband, in the present embodiment using a delay-line discriminator. Delay element 450 introduces a quarter wavelength delay into IF signal 440. IF signal 440 is mixed 460 with the output of delay element 450 producing baseband output 470. Blocking capacitor 480 passes the AC data carrying component to output terminal 490.

The DC component of output 470 corresponds to the error offset of the incoming signal frequency at antenna 430, in this case the output of transmitter 300, from the desired center frequency of receiver 400, in this case 60 GHz. This DC component is used to tune transmitter 600 after passing through filter 500.

Transmitter 600 accepts data input at port 610. The AC component of this data is passed by blocking capacitor 620 and combined with DC tuning signal 510 from filter 500. This combined signal modulates voltage controlled oscillator 630, producing an FM signal at antenna 640. The center frequency of transmitter 600 is 62.5 GHz, established by the DC level of tuning signal 510.

In operation, receiver 100 uses a receive frequency, 62.5 GHz in the preferred embodiment, higher than the reference frequency of 60 GHz. Receiver 400 uses a receive frequency of 60 GHz, lower than its reference frequency of 62.5 GHz.

Frequency lock is obtained across the duplex link in the following manner. Assume that transmitter 600, nominally operating at 62.5 GHz, is high in frequency. This will result in a high offset voltage 170 at the output of mixer 160 in receiver 100. This high offset is processed by filter 200, increasing the frequency of transmitter 300 through oscillator 330.

When the signal from transmitter 300 is processed by receiver 400, it produces an IF offset 470 at the output of mixer 460 which is low. This low offset is passed through filter 500, and lowers the operating frequency of oscillator 630 and transmitter 600, which is the desired feedback response.

Similarly, if the frequency of transmitter 600 is low in frequency, a low offset voltage 170 is produced, which is filtered and decreases the frequency of transmitter 300. This in turn produces a high offset 470 in receiver 400, raising the frequency of oscillator 600.

Thus, the frequencies of both transmitters are locked across the full duplex link. The overall design uses reference oscillators only for the receivers. Transmitter frequencies will lock and track over variations in temperature, voltage, and also through variations in manufacturing process and component tolerances.

To operate, this frequency correction loop through both transmitters and receivers requires one inversion. This inversion is obtained by using different sidebands for the intermediate frequencies in the two receivers; the lower sideband is used in receiver 100, and the upper sideband in receiver 400.

Figure 3:
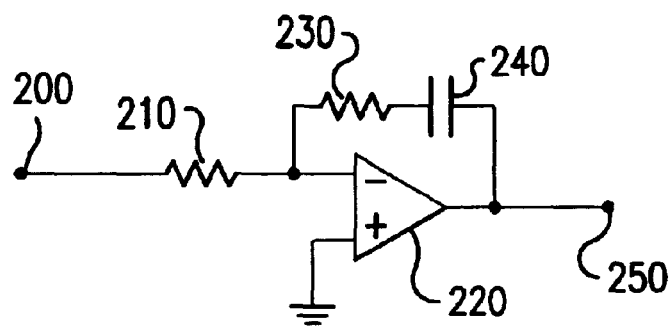
FIG. 3 is a diagram of a first embodiment of the frequency lock filter.

In a first embodiment of the invention, the architecture of FIG. 2 is used with a simple integrator as filters 200 and 500. This filter is shown in FIG. 3. When a simple damped integrator as shown in FIG. 3 is used, the overall system response is a second order loop, and is unconditionally stable.

In FIG. 3, input terminal 200 connects to the output of mixer 160 or 460, containing the desired DC frequency component as well as the AC data. This signal is passed through resistor 210 to operational amplifier 220. Resistor 230 and capacitor 240 complete the damped integrator. The time constant of the integrator should be lower than any operating frequency in the system. In the present embodiment, the time constant for this filter is on the order of one millisecond.

Figure 4:
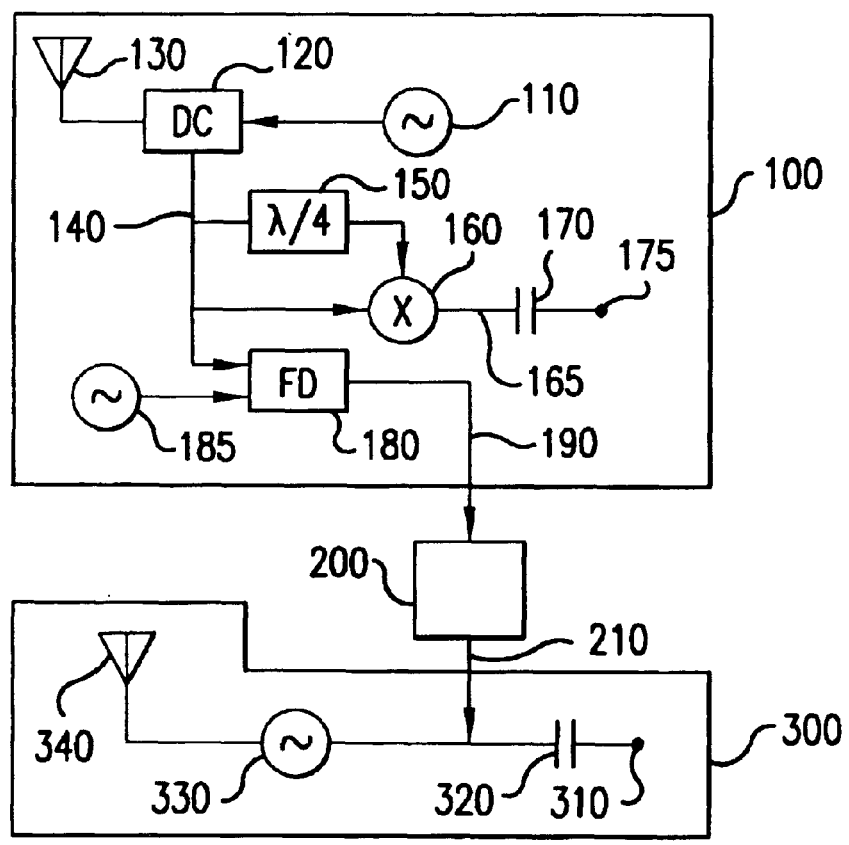
FIG. 4 is a diagram of an additional embodiment of the present invention.

While the embodiment of FIG. 2 used analog techniques, one node of an additional embodiment, as shown in FIG. 4, uses digital techniques. In receiver 100, reference oscillator 110 generates a reference signal for downconverter 120, which converts signal from antenna 130 to an intermediate frequency (IF). In the preferred embodiment, reference oscillator 110 is in the 60 GHz band, and the IF is 2.5 GHz. IF signal 140 is converted to baseband using a delay-line discriminator comprising quarter wavelength delay element 150, and mixer 160. The resulting baseband data 165 is decoupled 170 and presented at the data output 175.

IF signal 140 is also presented to frequency detector 180, which is also fed by reference oscillator 185. In the preferred embodiment reference oscillator 185 is a 32 MHz crystal oscillator, and frequency detector 180 is a LMX2330L from National Semiconductor Corporation. The output 190 of frequency detector 180, the offset error, is fed to filter 200, producing tuning signal 210.

Transmitter 300 accepts data input at port 310. The AC component of this data is passed by blocking capacitor 320 and combined with tuning signal 210 from filter 200. This combined signal modulates oscillator 330, producing an FM signal at antenna 340. The center frequency of transmitter 300 is controlled by tuning signal 210.

In operation, this embodiment produces offset error signal 190 digitally, but in all other respects operates in the same manner as the other embodiments disclosed.

Figure 5:
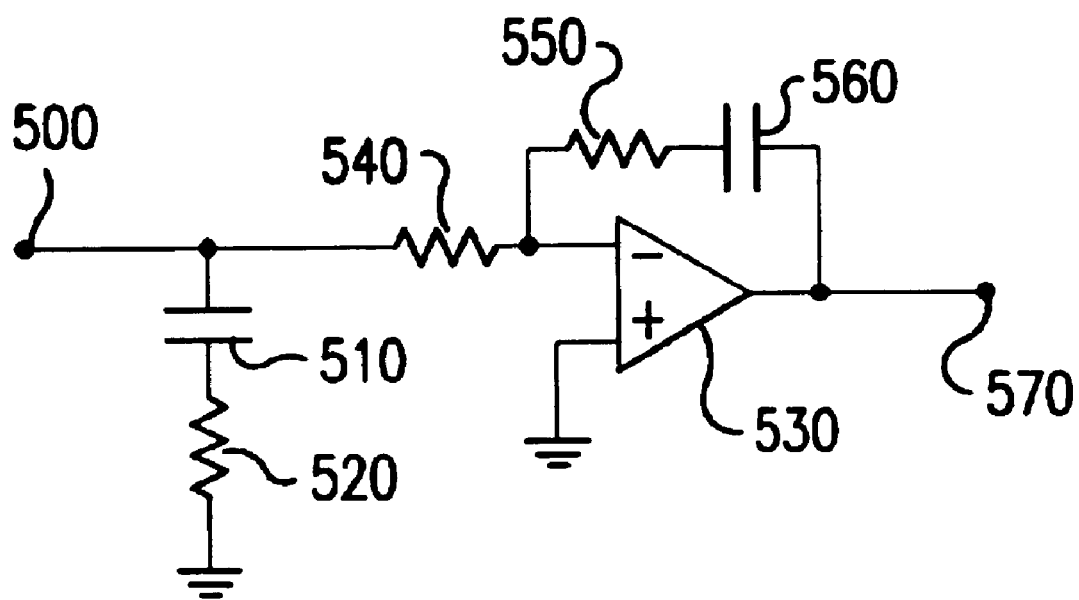
FIG. 5 shows filter 200 for use with the embodiment of FIG. 4.

FIG. 5 shows filter 200 for use with the embodiment of FIG. 4. As the output of the LMX2330L is a digital charge pump, that output 500 is first integrated by resistor 520 and capacitor 510. The resulting signal is filtered by op amp 530 through resistor 540 and the network comprised of resistor 550 and capacitor 560. The resulting tuning output is present at 570.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A full duplex communications link comprising:
    first receiver means for receiving a first signal at a first predetermined frequency, the receiver means having a signal input, data output, and an offset signal output representing the frequency difference between the first predetermined frequency and the frequency of the first signal,
    first transmitter means for transmitting a second signal at a second predetermined frequency, the transmitter means having a data input, frequency tuning input, and a signal output,
    first control means taking the offset signal from the first receiver and producing the frequency tuning input for the first transmitter, signaling the offset in the first signal to the second receiver,
    second receiver means for receiving the second signal at the second predetermined frequency, the receiver means having a signal input, data output, and an offset signal output representing the frequency difference between the first predetermined frequency and the frequency of the second signal,
    second transmitter means for transmitting the first signal at the first predetermined frequency, the transmitter means having a data input, frequency tuning input, and a signal output, and
    second control means for taking the offset signal from the second receiver and producing the frequency tuning input for the second transmitter, thereby responding to the offset sensed by the first receiver, and correcting the frequency of the second transmitter accordingly.

2. The communications link of claim 1 where both transmitters and receivers operate in the 60 GHz region.

3. The communications link of claim 1 where the receiver means further comprises downconverter means for downconverting the signal input to an intermediate frequency from which the data output and offset signal output are derived.

4. The communications link of claim 3 where the offset signal is derived from the intermediate frequency signal using a baseband demodulator.

5. The communications link of claim 4 where the baseband demodulator is a frequency discriminator.

6. The communications link of claim 5 where the baseband demodulator is a delay line discriminator.

7. The communications link of claim 3 where the offset signal is derived from the intermediate frequency signal using a frequency comparator driven by a reference.

8. The communications link of claim 1 where the signals between receivers and transmitters are propagated via antennas.

9. The communications link of claim 1 where the signals between receivers and transmitters are propagated by wire.

10. The communications link of claim 1 where the signals between receivers and transmitters are propagated by optical fiber.

* * * * *